United States Patent
Singh et al.

(10) Patent No.: US 7,791,193 B2
(45) Date of Patent: Sep. 7, 2010

(54) PAD OVER ACTIVE CIRCUIT SYSTEM AND METHOD WITH MESHED SUPPORT STRUCTURE

(75) Inventors: Inderjit Singh, Saratoga, CA (US);
Howard Lee Marks, Gilroy, CA (US);
Joseph David Greco, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 352 days.

(21) Appl. No.: 11/943,381

(22) Filed: Nov. 20, 2007

(65) Prior Publication Data

US 2008/0067687 A1 Mar. 20, 2008

Related U.S. Application Data

(62) Division of application No. 10/633,004, filed on Jul. 31, 2003, now Pat. No. 7,453,158.

(51) Int. Cl.
*H01L 23/34* (2006.01)

(52) U.S. Cl. .............................. 257/724; 257/E23.151; 257/680; 257/698; 349/110

(58) Field of Classification Search ............ 257/523.02, 257/E23.152, E23.194, E23.023, E23.151, 257/773, 698, 786, 758, 776, 737, 738, 724, 257/678, 680

See application file for complete search history.

(56) References Cited

U.S. PATENT DOCUMENTS

| | | | | |
|---|---|---|---|---|
| 4,636,832 A | * | 1/1987 | Abe et al. | 257/786 |
| 5,015,854 A | * | 5/1991 | Shigyo et al. | 250/584 |
| 5,043,788 A | * | 8/1991 | Omoto et al. | 257/371 |
| 5,046,023 A | * | 9/1991 | Katsura et al. | 345/619 |
| 6,063,030 A | * | 5/2000 | Vara et al. | 600/437 |
| 6,153,927 A | * | 11/2000 | Raj et al. | 257/680 |
| 6,600,222 B1 | * | 7/2003 | Levardo | 257/686 |
| 6,771,277 B2 | * | 8/2004 | Ohba | 345/629 |
| 7,154,175 B2 | * | 12/2006 | Shrivastava et al. | 257/723 |
| 7,307,638 B2 | * | 12/2007 | Leather et al. | 345/582 |
| 2001/0033009 A1 | * | 10/2001 | Inoue et al. | 257/668 |

* cited by examiner

*Primary Examiner*—Chris Chu
(74) *Attorney, Agent, or Firm*—Zilka-Kotab, PC

(57) ABSTRACT

An integrated circuit and method of fabricating the same are provided. Included are an active circuit, and a metal layer disposed, at least partially, above the active circuit. Further provided is a bond pad disposed, at least partially, above the metal layer. To prevent damage incurred during a bonding process, the aforementioned metal layer is meshed.

7 Claims, 11 Drawing Sheets

PAD OVER ACTIVE CIRCUIT SYSTEM AND METHOD WITH MESHED SUPPORT STRUCTURE

RELATED APPLICATION(S)

The present application is a divisional of an application filed Jul. 31, 2003 under application Ser. No. 10/633,004 now U.S. Pat. No. 7,453,158, which is incorporated herein by reference in its entirety.

FIELD OF THE INVENTION

The present invention relates to semiconductor integrated circuits, and more particularly to integrated circuits with increased circuit density and reduced size.

BACKGROUND OF THE INVENTION

Prior Art FIG. 1 illustrates an integrated circuit 100 constructed with bond pads around a periphery thereof, in accordance with the prior art. As shown, the integrated circuit 100 includes a semiconductor platform 101. Incorporated on the semiconductor platform 101 are a centrally-situated core 102 and a peripheral input/output (I/O) bus 104, which together define an "active circuit" of the integrated circuit 100. The I/O bus 104 is positioned around a periphery of the centrally-situated core 102.

Further included is a plurality of bond pads 106 which are disposed about the outer periphery of the I/O bus 104. As can be seen, the positioning of the bond pads 106 about the outer periphery of the I/O bus 104 requires that the overall size of the semiconductor platform 101 be augmented.

To further illustrate this, Prior Art FIG. 2 includes a cross-sectional view of the integrated circuit 100 of FIG. 1 taken along line 2-2. Similar to FIG. 1, the semiconductor platform 101 is shown to include the centrally-situated core 102 and I/O bus 104, which together define the "active circuit" of the integrated circuit 100 for processing electrical signals. Further shown are the bond pads 106 which require that the overall size of the semiconductor platform 101 be augmented.

FIG. 2 further illustrates underlying metal layers 206 that are interconnected by way of vias 208 for facilitating electric communication therebetween. As shown, the underlying metal layers 206 take-on a stacked configuration for allowing various unillustrated interconnections with the active circuit of the integrated circuit 100. Such underlying metal layers 206 are further coupled to the bond pads 106. Also included is a passivation layer 210 for protection purposes.

Trends toward increased circuit density and complexity in modern integrated circuit design have resulted in a desire for significant increases in both: 1) the number of input/output and power/ground pins per integrated circuit and, 2) the number of bond pads in order to connect to the package. To conserve active device area, it is desirable to reduce the bond pad pitch. However, smaller bond pads are more easily damaged by the large mechanical stresses inherent in the bonding process.

Generally, design rules have not allowed bonding pads over active areas, where they would be susceptible to damage from the large mechanical stresses of bonding. There is thus a continuing need to devise structures and layouts that satisfy the high-density requirements of advanced integrated circuit design and that would resist the high mechanical stresses of bonding.

DISCLOSURE OF THE INVENTION

An integrated circuit and method of fabricating the same are provided. Included are an active circuit, and a metal layer disposed, at least partially, above the active circuit. Further provided is a bond pad disposed, at least partially, above the metal layer. To prevent damage incurred during a bonding process, the aforementioned metal layer is meshed.

The active circuit may include an input/output (I/O) bus. Still yet, the active circuit may include a plurality of transistors. By virtue of providing an "interconnect" between a plurality of underlying metal layers and the bond pad, the meshed metal layer may include an interconnect metal layer.

In one embodiment, the metal layer may be meshed by including a plurality of openings formed therein. Still yet, the openings may be completely enclosed around a periphery thereof. Also, the openings may have a substantially square configuration.

In such embodiment, the openings may define a plurality of substantially linear first portions and a plurality of substantially linear second portions which intersect, to define a matrix of openings. Thus, a plurality interconnect vias may be formed in rows along a length of at least the first portions of the metal layer, in order to provide electric communication between the metal layer and the bond pad.

In one version of the present embodiment, the interconnect vias may include one single row for each of the first portions. In another related version of the present embodiment, the interconnect vias may include at least two spaced rows for each of the first portions. Optionally, a width of the first portions of the metal layer may be enlarged to accommodate the at least two spaced rows for each of the first portions.

In use, the openings of each of the aforementioned embodiments may be adapted for not only preventing damage incurred during a bonding process, but also facilitating an interlock between the metal layer and an inter-metal dielectric layer disposed between the metal layer and the bond pad. This thus strengthens the integrated circuit.

As an option, the inter-metal dielectric layer may be constructed from a material selected from the group consisting of a low-K dielectric material and a fluorinated silica glass (FSG) material.

A related method for fabricating an integrated circuit is further provided. Initially, an active circuit is constructed on a semiconductor platform. Moreover, a metal layer is deposited, at least partially, above the active circuit. Next, a dielectric layer is deposited, at least partially, above the interconnect metal layer. A bond pad is subsequently formed, at least partially, above the metal layer. Thereafter, a passivation layer is deposited. As mentioned hereinabove, the metal layer may be configured in a specific manner in accordance with the embodiments set forth hereinabove.

DESCRIPTION OF THE PREFERRED EMBODIMENTS

Figure 3:
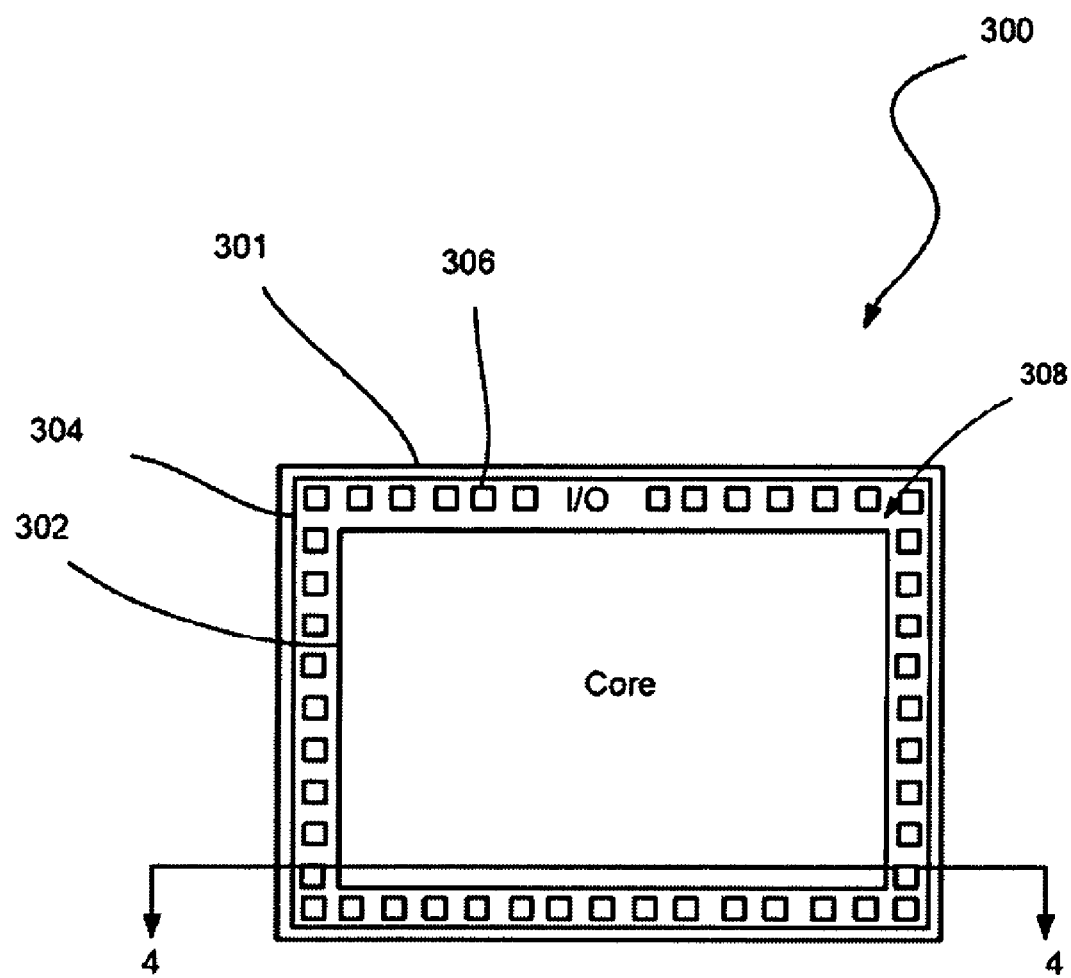
FIG. 3 illustrates an integrated circuit constructed with bond pads over active circuitry, in accordance with one embodiment.

FIG. 3 illustrates an integrated circuit 300 constructed with bond pads over active circuitry, in accordance with one embodiment. As shown, the integrated circuit 300 is provided including a semiconductor platform 301. Incorporated on the semiconductor platform 301 are a centrally-situated core 302 and a peripheral input/output (I/O) bus 304, which together define, at least in part, the "active circuit" of the integrated circuit 300. In the context of the present description, the active circuit 308 of the integrated circuit 300 may include the core 302, I/O bus 304 and/or any device formed in the semiconductor platform 301 of the integrated circuit 300.

As shown, a plurality of bond pads 306 is disposed, at least partially, above the active circuit 308 of the integrated circuit 300. Just by way of example, the bond pads 306 may be disposed, at least partially, above the outer periphery of the I/O bus 304. Of course, however, the bond pads 306 may be disposed above the core 302, and/or any other part of the active circuit 308.

Figure 1:
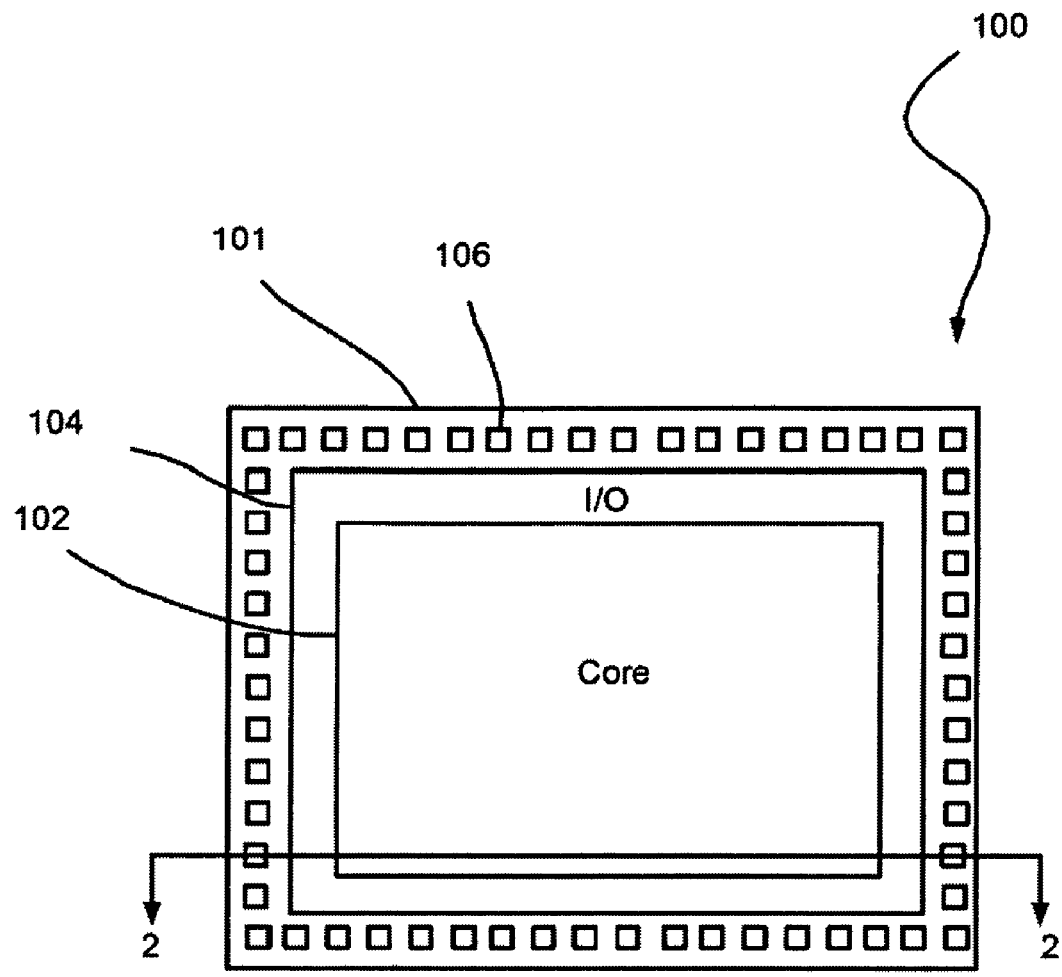
FIG. 1 illustrates an integrated circuit constructed with bond pads around a periphery thereof, in accordance with the prior art.
Figure 2:
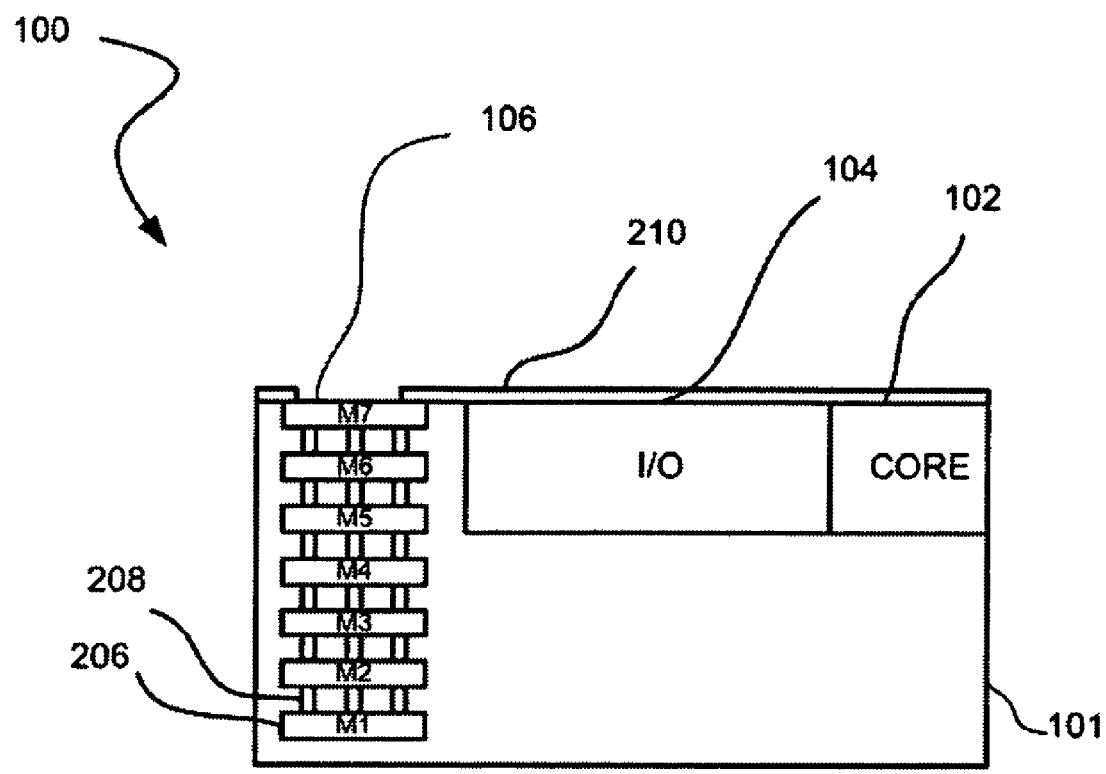
FIG. 2 illustrates a cross-sectional view of the integrated circuit of FIG. 1 taken along line 2-2, showing underlying metal layers that are interconnected by way of vias for facilitating electric communication therebetween.

As can be seen, with respect to the prior art integrated circuit 100 of FIG. 1, an area of the integrated circuit 300 is reduced, thus providing a more compact, cost effective integrated circuit.

Figure 4:
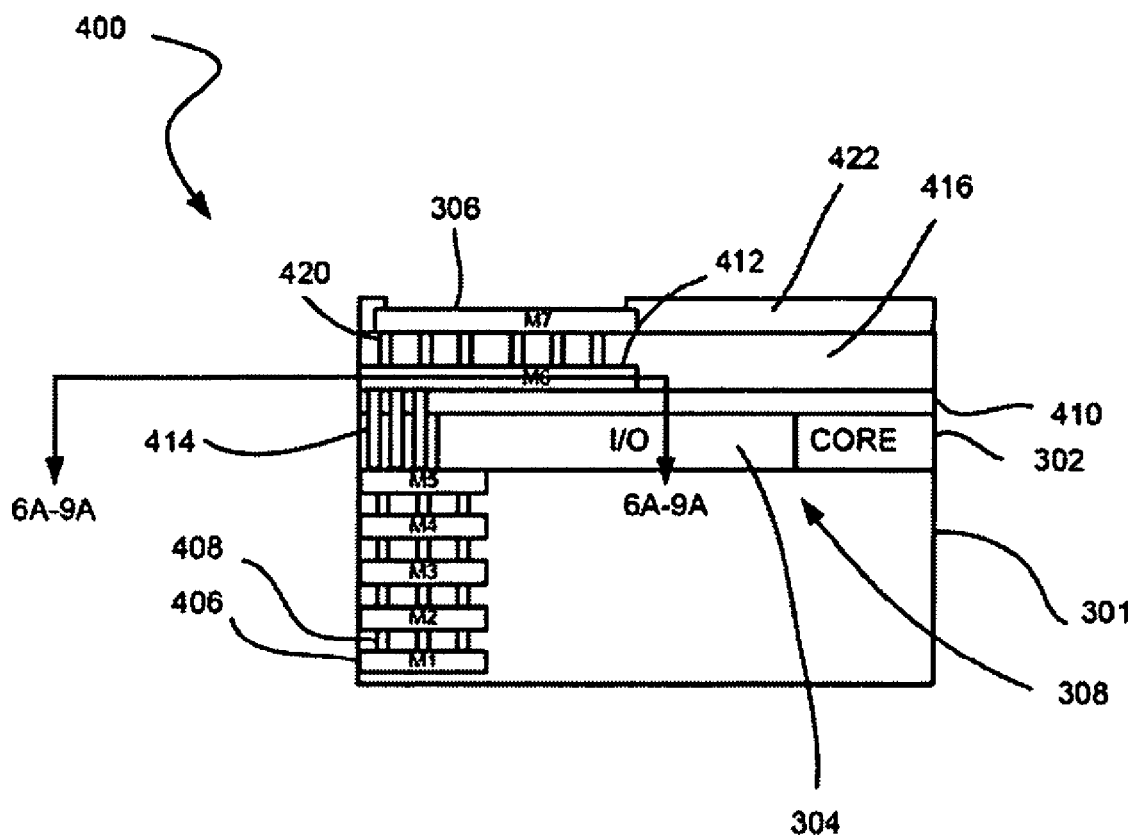
FIG. 4 illustrates a cross-sectional view of the integrated circuit of FIG. 3 taken along line 4-4, showing a plurality of vertically-spaced underlying metal layers that are interconnected by way of vias for facilitating electric communication therebetween.

FIG. 4 is a cross-sectional view of the integrated circuit 300 of FIG. 3 taken along line 4-4. Similar to FIG. 3, the semiconductor platform 301 is shown to include the centrally-situated core 302 and I/O bus 304, which together define the active circuit 308 of the integrated circuit 300, at least in part.

FIG. 4 further illustrates a plurality of vertically-spaced underlying metal layers 406 that are interconnected by way of vias 408 for facilitating electric communication therebetween. In one embodiment, the various vias described herein may be constructed with a tungsten material or the like.

As further shown, the underlying metal layers 406 take on a stacked configuration for allowing various unillustrated interconnections with the active circuit 308 of the integrated circuit 300. As an option, an underlying dielectric layer 410 may be situated above active circuit 308.

Deposited at least partially above the active circuit 308 of the integrated circuit 300 (with the underlying dielectric layer 410 optionally therebetween) is an interconnect metal layer 412. Such interconnect metal layer 412 is further electrically coupled to the underlying metal layers 406 by way of additional vias 414. An inter-metal dielectric (IMD) layer 416 is deposited, at least partially, above the interconnect metal layer 412. As an option, the inter-metal dielectric layer 146 may be constructed from a low-K dielectric material, a fluorinated silica glass (FSG) material, or any other type of desired material.

Defining the bond pads 306, is a top metal layer which is in electrical communication with the interconnect metal layer 412 by way of interconnect vias 420. As will soon be set forth, the interconnect vias 420 may be configured in various ways.

As mentioned earlier, the bond pads 306 are positioned, at least partially, above the active circuit 308 of the integrated circuit 300 to reduce the required area of the semiconductor platform 301. To prevent damage to the active circuit 308 during the bonding process, the interconnect metal layer 412 may be configured in a specific manner (i.e. the metal layer may be meshed, formed to define a frame for supporting vias, etc.). More information regarding such meshed, frame-type configurations will be set forth hereinafter in greater detail.

Figure 5:
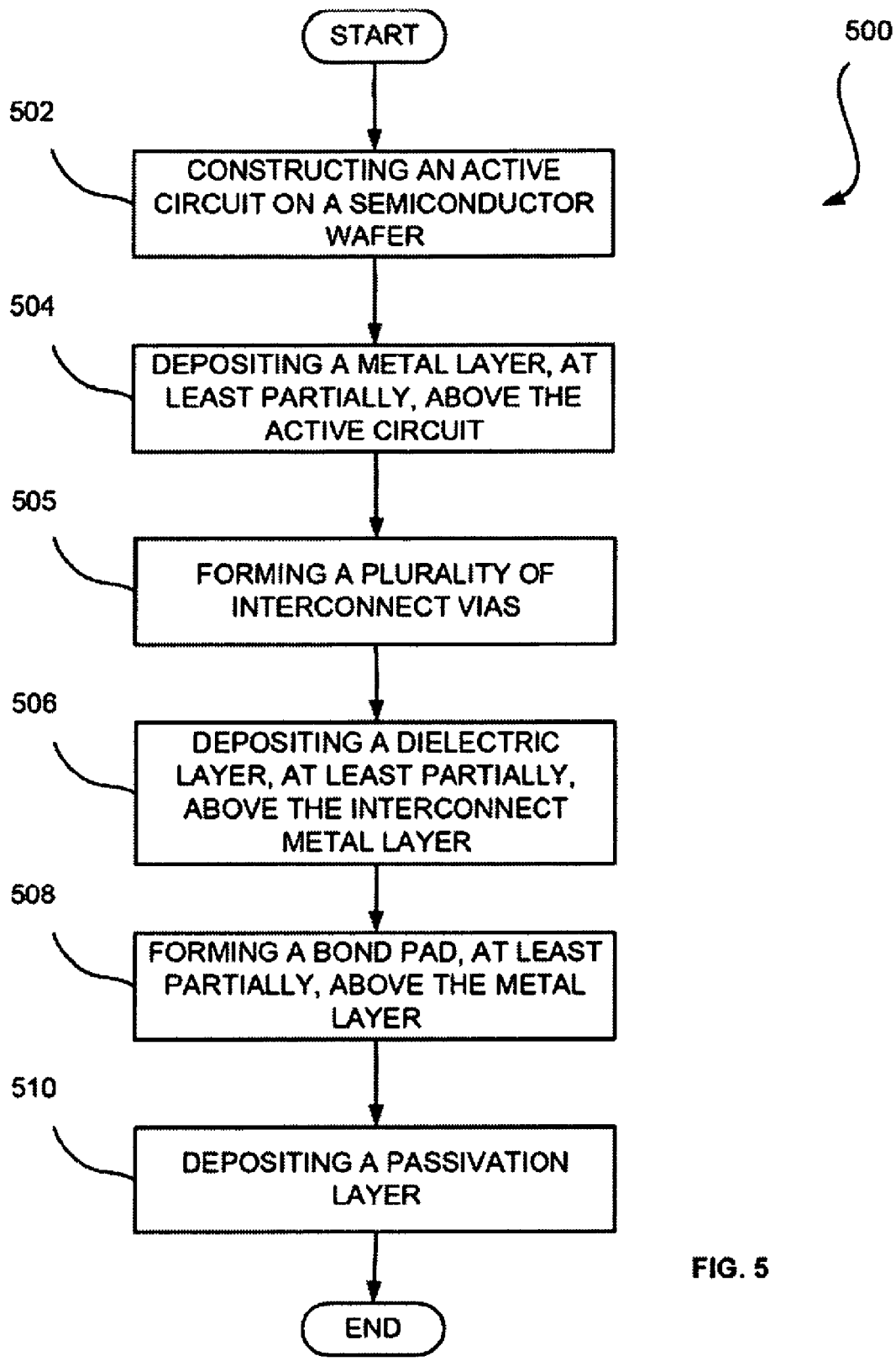
FIG. 5 illustrates a method for fabricating a pad over active circuit system, in accordance with one embodiment.

FIG. 5 illustrates a method 500 for fabricating a pad over active circuit system, in accordance with one embodiment. In one embodiment, the present method 500 may be carried out to produce an integrated circuit such as those set forth in the remaining figures. Of course, it should be noted that the present method 500 may be carried out in any desired context.

Initially, in operation 502, an active circuit (i.e. see, for example, active circuit 308 and related components of FIGS. 3 and 4) is constructed on a semiconductor platform, in accordance with conventional procedures and techniques.

Moreover, in operation 504, a metal layer is deposited, at least partially, above the active circuit. A plurality of interconnect vias 505 are then formed. Next, in operation 506, a dielectric layer is deposited, at least partially, above the interconnect metal layer.

A bond pad is subsequently formed in operation 508, at least partially, above the metal layer. Thereafter, a passivation layer is deposited in operation 510. As an option, the passivation layer may be constructed from a SiON material or the like.

As mentioned hereinabove, the metal layer deposited in operation 504 may be configured in accordance with the embodiments set forth herein (i.e. the metal layer may be meshed, formed to define a frame for supporting vias, etc.).

More information regarding the foregoing operations will now be set forth in the context of various exemplary embodiments. It should be noted that the following embodiments are set forth for illustrative purposes only, and should not be construed as limiting in any manner.

FIGS. 6A-6E illustrate an integrated circuit 600 during various stages of processing in accordance with the method 500 of FIG. 5, per one embodiment where the interconnect metal layer is meshed. Of course, such integrated processing stages may be set forth in the context of any desired process.

Figure 6A:
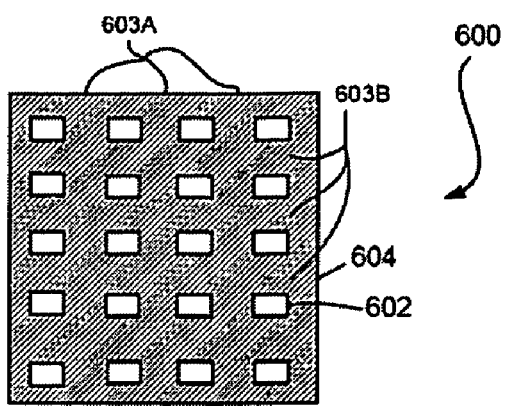
FIGS. 6A-6E illustrate an integrated circuit during various stages of processing in accordance with the method of FIG. 5, per one embodiment where the interconnect metal layer is meshed.

FIG. 6A illustrates a stage where an interconnect metal layer 604 is deposited, in accordance with operation 504 of the method 500 of FIG. 5, for example. As illustrated, the interconnect metal layer 604 is meshed by including a plurality of openings 602 formed completely therethrough between an upper surface and a lower surface thereof. Of course, in another embodiment, the openings may be formed only partially therethrough in the upper surface of the interconnect metal layer 604, without extending through the lower surface thereof.

Still yet, at least a portion of the openings 602 may be completely enclosed around a periphery thereof. Also, the openings 602 may have a substantially square configuration. Of course, any shape may be used per the desires of the user.

Such openings 602 may be formed using standard photolithography techniques such as etching, etc. In such embodiment, the openings 602 may define a plurality of substantially linear first portions 603A and a plurality of substantially linear second portions 603B which intersect, to define a matrix of openings 602.

Figure 6B:
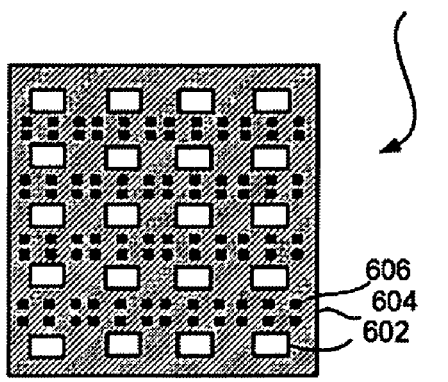

FIG. 6B illustrates a subsequent stage where a plurality interconnect vias 606 are formed in rows along a length of at least the first portions, in accordance with operation 505 of the method 500 of FIG. 5, for example. The interconnect vias 606 serve to provide electric communication between the interconnect metal layer 604 and the bond pad, illustrated earlier.

In the present embodiment, the interconnect vias 606 may include at least two spaced rows for each of the first portions 603B. Optionally, a width of the first portions 603B may be enlarged to accommodate the two or more spaced rows for each of the first portions 603B. As a further option, the interconnect vias 606 may be equally spaced. Of course, the interconnect vias 606 may take on any desired configuration.

Figure 6C:
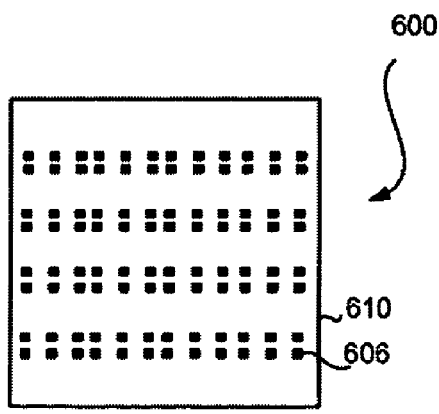

Still yet, FIG. 6C illustrates still another processing stage where an inter-metal dielectric layer 610 is deposited, in accordance with operation 506 of the method 500 of FIG. 5, for example.

Figure 6D:
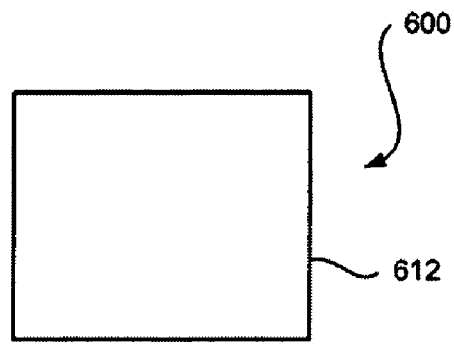
Figure 6E:
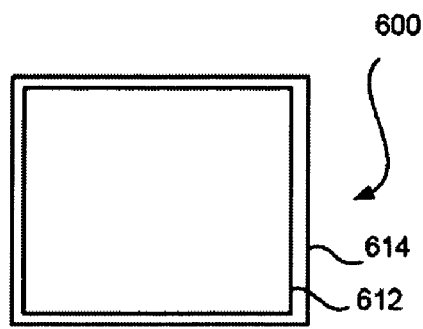

FIG. 6D illustrates a subsequent processing stage where a top metal layer 612 is deposited above the inter-metal dielectric layer 610 in electrical communication with the interconnect vias 606. Note, for example, operation 508 of the method 500 of FIG. 5. Such top metal layer 612 thus serves as the bond bad.

Finally, a passivation layer 614 is deposited, in accordance with operation 510 of the method 500 of FIG. 5, for example. See FIG. 6E.

FIGS. 7A-7E illustrate an integrated circuit 700 during various stages of processing in accordance with the method 500 of FIG. 5, per another embodiment where the interconnect metal layer is meshed. Of course, such integrated processing stages may be set forth in the context of any desired process.

Figure 7A:
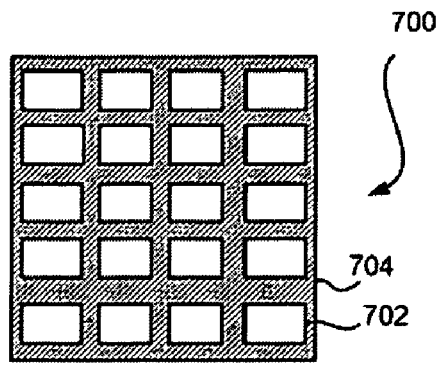
FIGS. 7A-7E illustrate an integrated circuit during various stages of processing in accordance with the method of FIG. 5, per another embodiment where the interconnect metal layer is meshed.

FIG. 7A illustrates a stage where an interconnect metal layer 704 is deposited, in accordance with operation 504 of the method 500 of FIG. 5, for example. As illustrated, the interconnect metal layer 704 is meshed by including a plurality of openings 702 formed therein. As in the previous embodiment, such openings 702 may define a plurality of substantially linear first portions and a plurality of substantially linear second portions which intersect, to define a matrix of openings 702.

In the present embodiment, the openings 702 may be larger in size with respect to the previous embodiment of FIGS. 6A-6E. To this end, the linear portions may be thinner, for reasons that will soon become apparent.

Figure 7B:
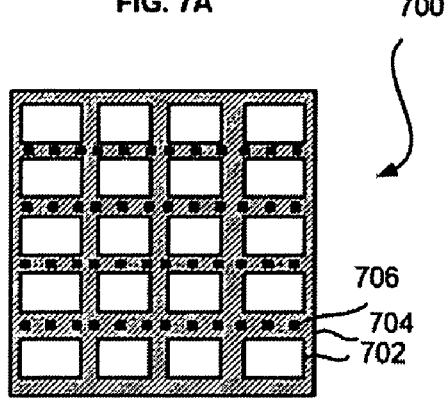

FIG. 7B illustrates a subsequent stage where a plurality interconnect vias 706 are formed in rows along a length of at least the first portions, in accordance with operation 505 of the method 500 of FIG. 5, for example. The interconnect vias 706 serve to provide electric communication between the interconnect metal layer 704 and the bond pad, illustrated earlier.

As shown, the interconnect vias 706 may form only a single row on each of the first portions. As is now apparent from the present and previous embodiment, the interconnect vias 706 may form any desired number of rows and take on any desired configuration.

Figure 7C:
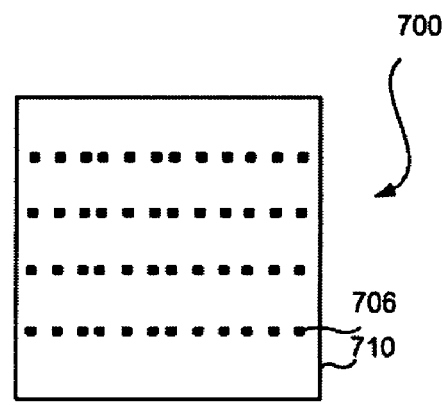

Still yet, FIG. 7C illustrates still another processing stage where an inter-metal dielectric layer 710 is deposited, in accordance with operation 506 of the method 500 of FIG. 5, for example.

Figure 7D:
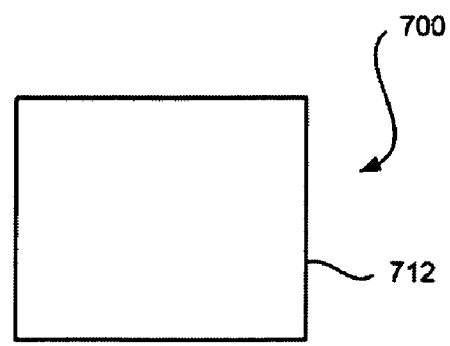
Figure 7E:
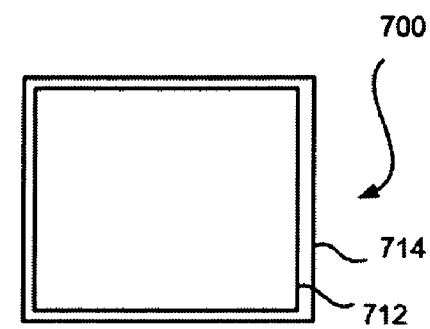

FIG. 7D illustrates a subsequent processing stage where a top metal layer 712 is deposited above the inter-metal dielectric layer 710 in electrical communication with the interconnect vias 706. Note, for example, operation 508 of the method 500 of FIG. 5. Finally, a passivation layer 714 is deposited, in accordance with operation 510 of the method 500 of FIG. 5, for example. See FIG. 7E.

FIGS. 8A-8E illustrate an integrated circuit 800 during various stages of processing in accordance with the method 500 of FIG. 5, in accordance with another embodiment where the interconnect metal layer takes on an enclosed "frame"-type configuration. Of course, such integrated processing stages may be set forth in the context of any desired process.

Figure 8A:
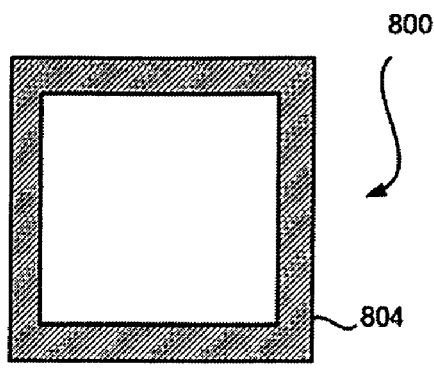
FIGS. 8A-8E illustrate an integrated circuit during various stages of processing in accordance with the method of FIG. 5, in accordance with another embodiment where the interconnect metal layer takes on an enclosed "frame"-type configuration.

FIG. 8A illustrates a stage where an interconnect metal layer 804 is deposited, in accordance with operation 504 of the method 500 of FIG. 5, for example. As illustrated, the interconnect metal layer 804 defines a frame with an outer periphery and an inner periphery. Such frame may optionally be enclosed, as shown.

Figure 8D:
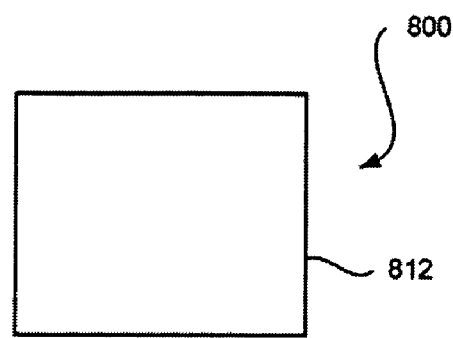
Figure 8B:
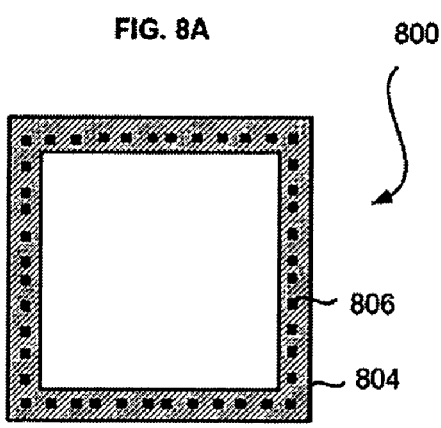
Figure 8E:
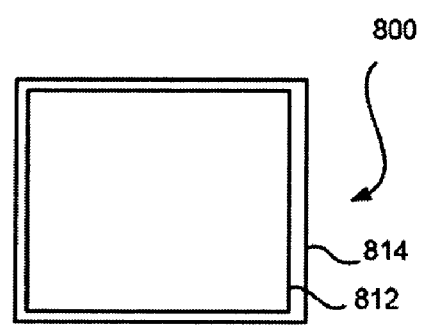

FIG. 8B illustrates a subsequent stage where a plurality interconnect vias 806 are formed along the frame, in accordance with operation 505 of the method 500 of FIG. 5, for example. The interconnect vias 806 serve to provide electric communication between the interconnect metal layer 804 and the bond pad, illustrated earlier. As shown, the interconnect vias 806 may be formed along an entire length of the frame defined by the interconnect metal layer 804.

Figure 8C:
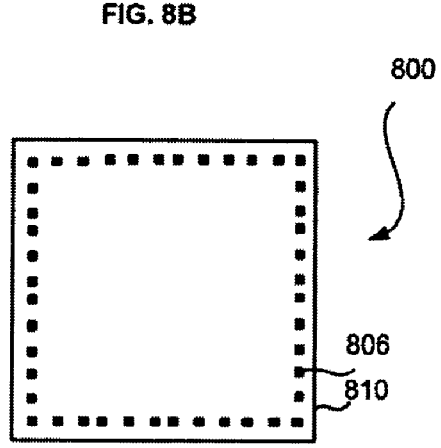

FIG. 8C illustrates still another processing stage where an inter-metal dielectric layer 810 is deposited, in accordance with operation 506 of the method 500 of FIG. 5, for example.

FIG. 8D illustrates a subsequent processing stage where a top metal layer 812 is deposited above the inter-metal dielectric layer 810 in electrical communication with the interconnect vias 806. Note, for example, operation 508 of the method 500 of FIG. 5. Finally, a passivation layer 814 is deposited, in accordance with operation 510 of the method 500 of FIG. 5, for example. See FIG. 8E.

FIGS. 9A-9E illustrate an integrated circuit 900 during various stages of processing in accordance with the method 500 of FIG. 5, per another embodiment where the interconnect metal layer takes on an enclosed "frame"-type configuration in addition to a meshed configuration. Of course, such integrated processing stages may be set forth in the context of any desired process.

Figure 9A:
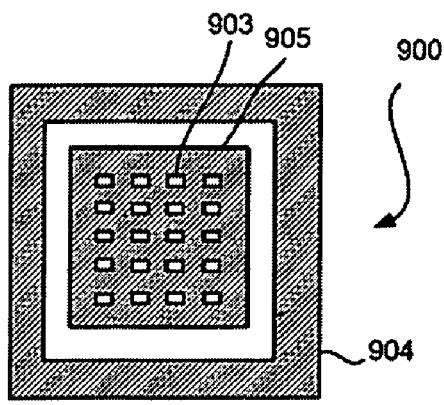
FIGS. 9A-9E illustrate an integrated circuit during various stages of processing in accordance with the method of FIG. 5, per another embodiment where the interconnect metal layer takes on an enclosed "frame"-type configuration in addition to a meshed configuration.

FIG. 9A illustrates a stage where an interconnect metal layer 904 is deposited, in accordance with operation 504 of the method 500 of FIG. 5, for example. As illustrated, the interconnect metal layer 904 defines a frame with an outer periphery and an inner periphery. Such frame may optionally be enclosed, as shown.

The interconnect metal layer 904 may define an island 905 formed within and spaced from the inner periphery of the frame of the interconnect metal layer 904. Such island 905 of the interconnect metal layer 904 may further include a plurality of openings 903 formed therein. Such openings 903 may be completely enclosed around a periphery thereof, and optionally have a substantially square configuration.

Figure 9D:
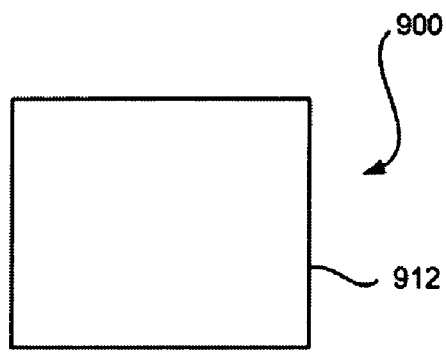
Figure 9B:
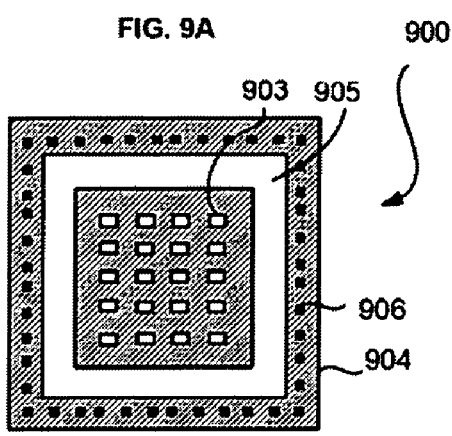
Figure 9E:
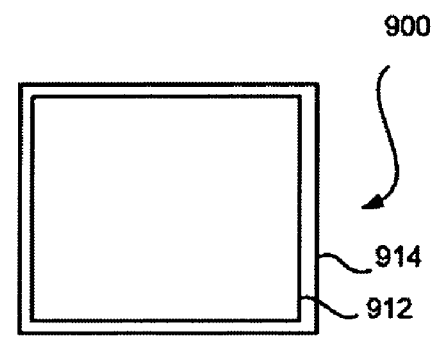

FIG. 9B illustrates a subsequent stage where a plurality interconnect vias 906 are formed along the frame, in accordance with operation 505 of the method 500 of FIG. 5, for example. The interconnect vias 906 serve to provide electric communication between the interconnect metal layer 904 and the bond pad, illustrated earlier. Similar to previous embodiments, the interconnect vias 906 may be formed along an entire length of the frame defined by the interconnect metal layer 904.

Figure 9C:
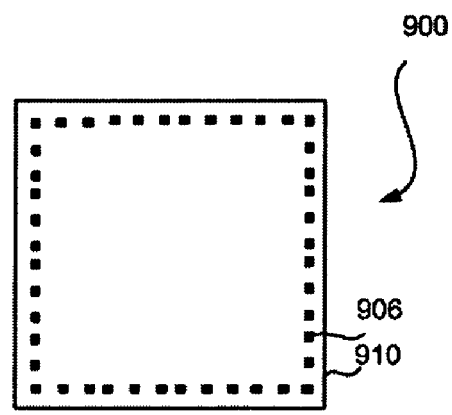

FIG. 9C illustrates still another processing stage where an inter-metal dielectric layer 910 is deposited, in accordance with operation 506 of the method 500 of FIG. 5, for example.

FIG. 9D illustrates a subsequent processing stage where a top metal layer 912 is deposited above the inter-metal dielectric layer 910 in electrical communication with the interconnect vias 906. Note, for example, operation 508 of the method 500 of FIG. 5. Finally, a passivation layer 914 is deposited, in accordance with operation 510 of the method 500 of FIG. 5, for example. See FIG. 9E.

Thus, the interconnect metal layer of the aforementioned embodiments may be adapted for not only preventing damage incurred during a bonding process, but also facilitating an interlock between the interconnect metal layer and the inter-metal dielectric layer disposed between the interconnect metal layer and the top metal layer. This is accomplished by the dielectric material of the inter-metal dielectric layer being deposited within the frame, openings, etc. This thus strengthens the resultant integrated circuit.

Figure 10:
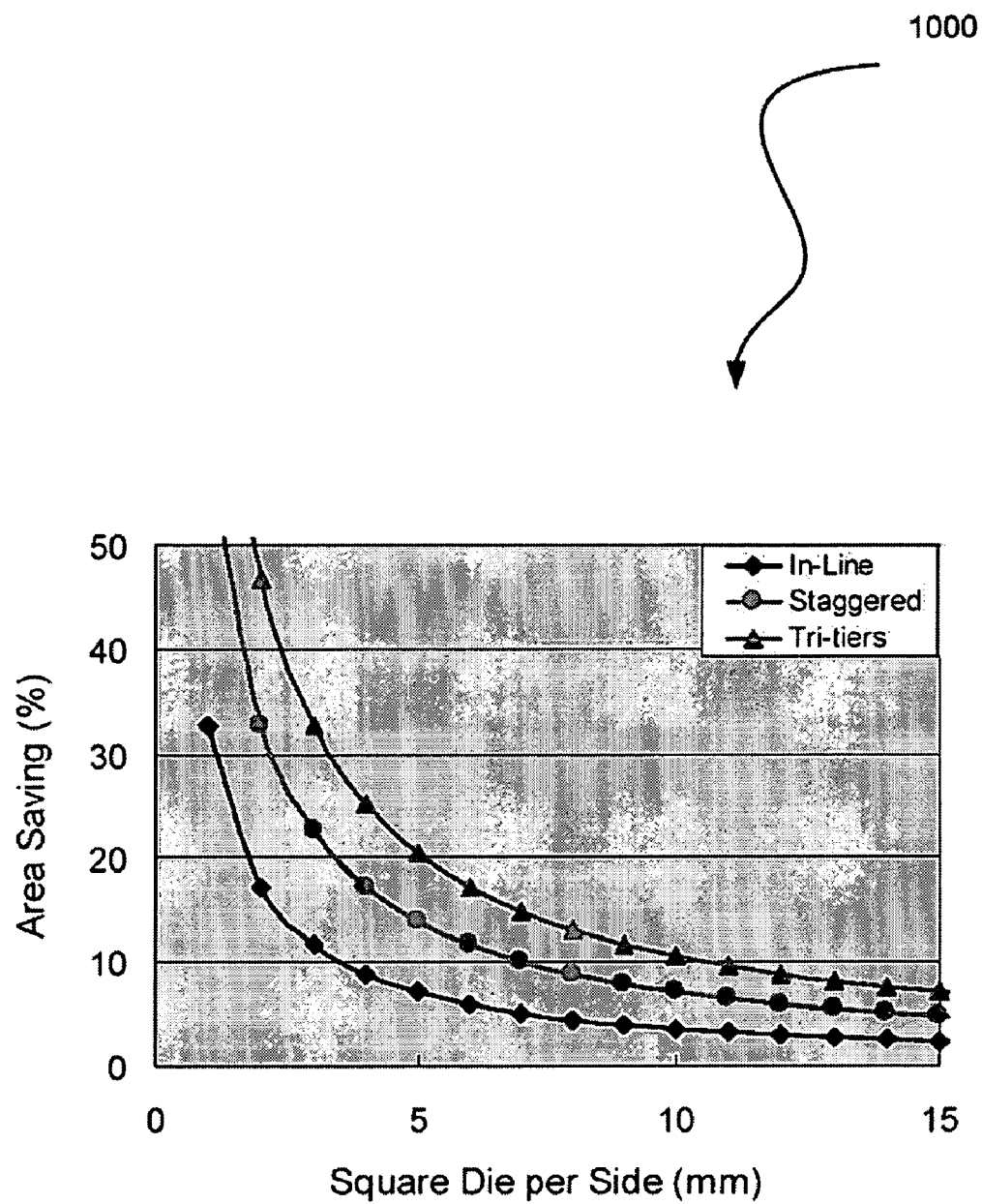
FIG. 10 includes a graph showing the various area of the integrated circuit that is saved by virtue of the previous embodiments.

FIG. 10 includes a graph 1000 showing the various area of the integrated circuit that is saved by virtue of the previous embodiments. For a smaller integrated circuit where the pads are laid out in a staggered, triple tier, or quad tier configuration; an exemplary size-saving of the integrated circuit is that shown in the figure.

For a core-limited integrated circuit, in order to maintain a small size and fit all necessary bond pads within the perimeter of the integrated circuit, bond pad pitches are often reduced. There are traditionally assembly limitations of bond pad pitch in production that meet acceptable assembly and test yields. For example, a production limit may include a 45 micron pad pitch. Issues with such fine pitch devices sometimes require bonding very small bond pads, due to a smaller pad opening. Thus, the wire diameter is usually reduced and this impacts the wire length which, in turn, creates a finer bond finger pitch on the substrate. To this end, the cost of the product is further increased.

By enabling the bonds to be placed over an active circuit without damage during the bonding process, the limitation of compacting the pads is no longer a hard requirement. The in-line pads can be spaced apart and staggered, or placed in multiple rows/columns over a larger area above the active circuit.

It should be noted that the interconnection techniques discussed herein may be applicable to wire bonding, Au thermosonic stud bumping, flip-chip solder bump and tape automated bonding (TAB), etc.

Figure 11:
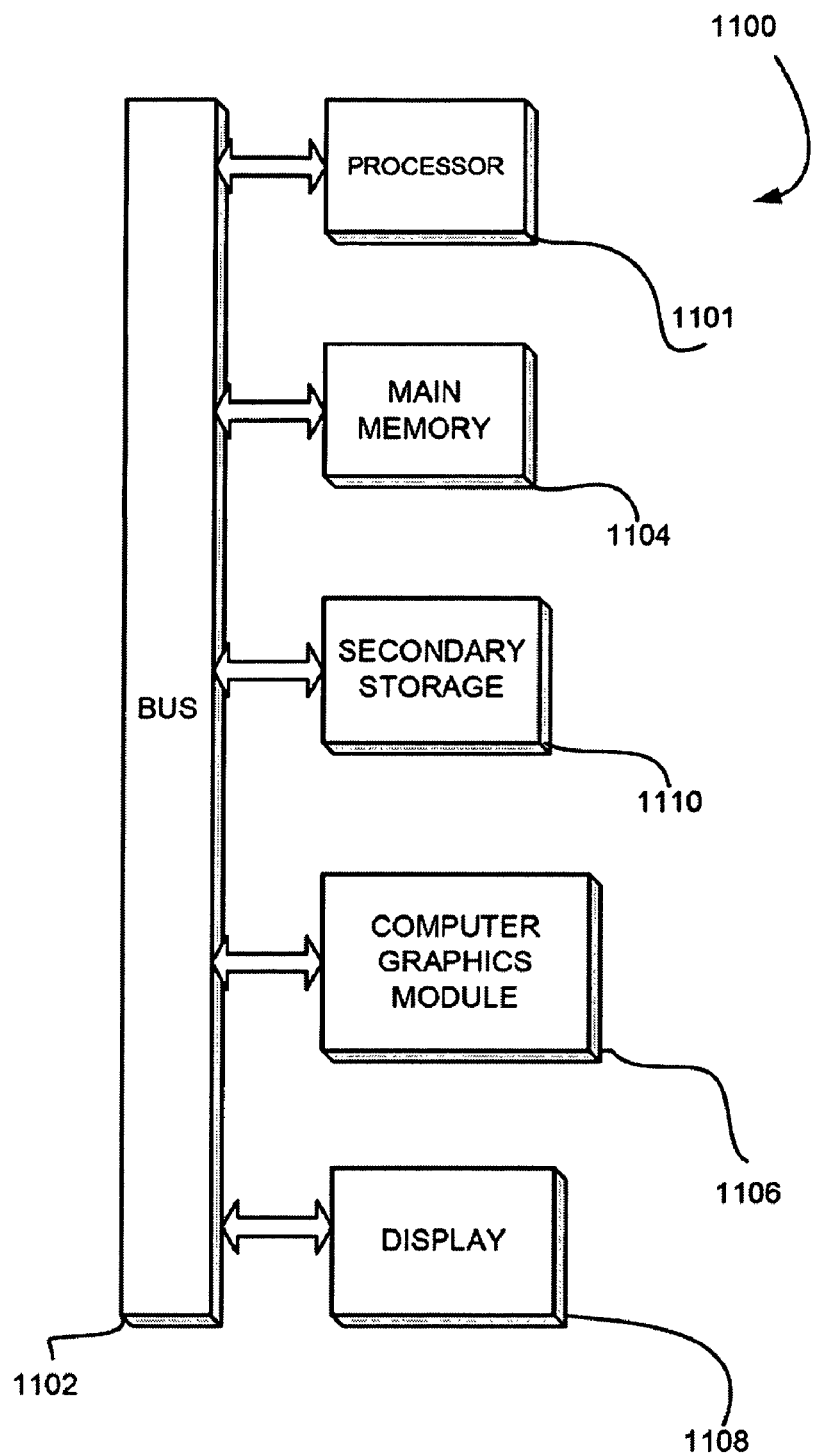
FIG. 11 illustrates an exemplary system in which the integrated circuit of the various previous embodiments may be implemented.

FIG. 11 illustrates an exemplary computer system 1100 in which the integrated circuit of the various previous embodiments may be implemented. As shown, a computer system 1100 is provided including one or more processors, such as processor 1101, which is connected to a communication bus 1102. The computer system 1100 also includes a main memory 1104. Control logic (software) and data are stored in the main memory 1104 which may take the form of random access memory (RAM). The computer system 1100 also includes a graphics module 1106 and a display 1108, i.e. a computer monitor.

The computer system 1100 may also include a secondary storage 1110. The secondary storage 1110 includes, for example, a hard disk drive and/or a removable storage drive, representing a floppy disk drive, a magnetic tape drive, a compact disk drive, etc. The removable storage drive reads from and/or writes to a removable storage unit in a well known manner. Computer programs, or computer control logic algorithms, may be stored in the main memory 1104 and/or the secondary storage 1110. Such computer programs, when executed, enable the computer system 1100 to perform various functions. Memory 1104 and storage 1110 are thus examples of computer-readable media.

In one embodiment, the integrated circuit of the various previous figures may be implemented as the processor 1101 [i.e. a central processing unit (CPU), etc.], the graphics module 1106, a chipset (i.e. a group of integrated circuits designed to work and sold as a unit for performing related functions, etc.), or any other integrated circuit for that matter. In the example of a graphics module 1106, such integrated circuit may include a transform module, a lighting module, and a rasterization module. Each of the foregoing modules may be situated on a single semiconductor platform to form a graphics processing unit (GPU).

Still yet, the integrated circuit of the various previous figures may be implemented in the context of a general computer system, a circuit board system, a game console system dedicated for entertainment purposes, an application-specific system, or any other desired system.

While various embodiments have been described above, it should be understood that they have been presented by way of example only, and not limitation. Thus, the breadth and scope of a preferred embodiment should not be limited by any of the above described exemplary embodiments, but should be defined only in accordance with the following claims and their equivalents.

What is claimed is:
1. A system, comprising:
a bus;
a display in communication with the bus;
a memory in communication with the bus; and
an integrated circuit in communication with the display and the memory via the bus, the integrated circuit including an active circuit; a metal layer disposed, at least partially, above the active circuit; and a bond pad disposed, at least partially, above the metal layer; wherein the metal layer is meshed;
wherein the bond pad is only disposed above an outer periphery of an input/output (I/O) bus of the active circuit;
wherein an interconnect metal layer of the metal layer is electrically coupled to a plurality of underlying metal layers by way of vias, the plurality of underlying metal layers disposed at least in part below the active circuit;
wherein the interconnect metal layer interconnects the bond pad with the plurality of underlying metal layers;
wherein the interconnect metal layer of the metal layer defines an island, the island including a plurality of openings, the openings defining a plurality of substantially linear first portions and a plurality of substantially linear second portions which intersect, where intercon- nect vias formed in rows along a length of at least the first portions provide communication between the interconnect metal layer and the bond pad;

wherein the openings are adapted for facilitating an interlock between the interconnect metal layer of the metal layer and an inter-metal dielectric layer disposed between the metal layer and the bond pad.

2. The system as recited in claim 1, wherein the system includes a general computer.

3. The system as recited in claim 1, wherein the system includes a game console.

4. The system as recited in claim 1, wherein the integrated circuit includes at least one of a central processing unit, a graphics processing unit, and one of a plurality of integrated circuits included in a chipset.

5. The system as recited in claim 1, wherein the system includes a circuit board.

6. The system as recited in claim 1, wherein the inter-metal dielectric layer is constructed from a low-K dielectric material.

7. The system as recited in claim 1, wherein the inter-metal dielectric layer is constructed from a fluorinated silica glass (FSG) material.

* * * * *